(12) United States Patent
Cai et al.

(10) Patent No.: US 9,076,775 B2
(45) Date of Patent: Jul. 7, 2015

(54) SYSTEM AND METHOD OF VARYING GATE LENGTHS OF MULTIPLE CORES

(71) Applicant: QUALCOMM Incorporated, San Diego, CA (US)

(72) Inventors: Ming Cai, San Diego, CA (US); Samit Sengupta, San Diego, CA (US); Chock Hing Gan, San Diego, CA (US); PR Chidambaram, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/017,635

(22) Filed: Sep. 4, 2013

(65) Prior Publication Data

US 2015/0061037 A1 Mar. 5, 2015

(51) Int. Cl.
*H01L 27/088* (2006.01)
*H01L 21/70* (2006.01)
*H01L 21/8238* (2006.01)
*H01L 29/49* (2006.01)
*H01L 21/28* (2006.01)
*G06F 17/50* (2006.01)
*H01L 21/66* (2006.01)

(52) U.S. Cl.
CPC ...... *H01L 29/4916* (2013.01); *H01L 21/28035* (2013.01); *G06F 17/5068* (2013.01); *H01L 22/14* (2013.01)

(58) Field of Classification Search
CPC ............ H01L 21/86; H01L 21/823437; H01L 21/82431; H01L 27/0207; H01L 27/0629; H01L 29/1083; H01L 29/66492; H01L 29/7833; H01L 21/28035; H01L 29/4916; H01L 22/14; G06F 17/5068

USPC .................... 257/401.368, 506; 438/197, 585
See application file for complete search history.

(56) References Cited

U.S. PATENT DOCUMENTS

| 5,606,518 | A | 2/1997 | Fang et al. |
| 6,369,412 | B1 | 4/2002 | Ueda et al. |
| 6,912,705 | B2* | 6/2005 | Korobkov ..................... 716/123 |
| 7,200,824 | B1 | 4/2007 | Sidhu et al. |
| 8,302,064 | B1 | 10/2012 | Sadoughi et al. |
| 8,390,331 | B2 | 3/2013 | Veendrick et al. |
| 2007/0212837 | A1 | 9/2007 | Mizuno et al. |
| 2008/0113480 | A1* | 5/2008 | Nishida et al. ................ 438/278 |
| 2010/0324850 | A1* | 12/2010 | Jung et al. ....................... 702/69 |

(Continued)

FOREIGN PATENT DOCUMENTS

EP 1349174 A2 10/2003

OTHER PUBLICATIONS

Carlson B., et al., "SmartReflex™ Power and Performance Management Technologies: reduced power consumption, optimized performance," Texas Instruments, Feb. 2008, 8 pages.

(Continued)

*Primary Examiner* — Nikolay Yushin
(74) *Attorney, Agent, or Firm* — Toler Law Group, PC

(57) ABSTRACT

A method includes forming a first poly-silicon gate of a first transistor, the first poly-silicon gate having a first length. The first transistor is located in a first core. The method also includes forming a second poly-silicon gate of a second transistor, the second poly-silicon gate having a second length that is shorter than the first length. The second transistor is located in a second core. The first core is located closer to a center of a semiconductor die than the second core.

37 Claims, 5 Drawing Sheets

(56) References Cited

U.S. PATENT DOCUMENTS

| | | |
|---|---|---|
| 2012/0042292 A1 | 2/2012 | Abouzeid et al. |
| 2012/0180016 A1 | 7/2012 | Chidambaram et al. |
| 2013/0027083 A1 | 1/2013 | Ando et al. |
| 2013/0086395 A1 | 4/2013 | Liu |

OTHER PUBLICATIONS

International Search Report and Written Opinion for International Application No. PCT/US2014/048944, ISA/EPO, Date of Mailing Oct. 22, 2014, 12 pages.

* cited by examiner

SYSTEM AND METHOD OF VARYING GATE LENGTHS OF MULTIPLE CORES

I. FIELD

The present disclosure is generally related to processor cores.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing capabilities.

Electronic devices (e.g., wireless telephones, laptop computers, tablets, etc.) may employ multi-core processors to increase processing capabilities as compared to single core processors. A multi-core processor includes multiple central processing units ("cores"), and each core of a multi-core processor may have an identical design. However, a conventional multi-core processor suffers from core-to-core leakage current variations (e.g., two cores may have significantly different leakage current) and core-to-core clock speed variations (e.g., two cores may have significantly different clock speeds), such as due to manufacturing process variations and various etch/loading effects across the multi-core processor. Core-to-core leakage current variations may reduce a manufacturing yield of multi-core processors as quality screening is often determined by a lowest performing core (e.g., a core with largest leakage current). The core-to-core clock speed variations may also reduce the manufacturing yield as a particular multi-core processor may be found to be defective due to the core-to-core clock speed variation exceeding a tolerance threshold.

III. SUMMARY

Systems and methods of reducing core-to-core leakage current variations and/or core-to-core performance variations are disclosed. When a multi-core processor is manufactured, the described techniques may selectively form poly-silicon gates of transistors of different cores of the multi-core processor such that the poly-silicon gates of selected cores have increased gate lengths as compared to non-selected cores.

For example, a semiconductor die (e.g., a multi-core processor) may include a plurality of cores. The plurality of cores may include a first core, a second core, a third core, and a fourth core. The first core may be located closer to a center of the semiconductor die than the second core. The third core may be located closer to the center of the semiconductor die than the fourth core. The first core and the third core may be inner cores, and the second core and the fourth core may be outer cores. Poly-silicon gates of transistors of the inner cores may have a first length. Poly-silicon gates of corresponding transistors of the outer cores may have a second length that is shorter than the first length. The first length may be determined based on empirical data related to the semiconductor die.

In a particular embodiment, a method includes forming a first poly-silicon gate of a first transistor, the first poly-silicon gate having a first length. The first transistor is located in a first core. The method also includes forming a second poly-silicon gate of a second transistor, the second poly-silicon gate having a second length that is shorter than the first length. The second transistor is located in a second core, and the first core is located closer to a center of a semiconductor die as compared to the second core.

In another particular embodiment, an apparatus includes a first core that includes a first transistor. The first transistor includes a first poly-silicon gate, the first poly-silicon gate having a first length. The apparatus also includes a second core that includes a second transistor. The second transistor includes a second poly-silicon gate having a second length that is shorter than the first length. The first core is located closer to a center of a semiconductor die than the second core.

One particular advantage provided by at least one of the disclosed embodiments is an ability to reduce core-to-core leakage current variations and/or core-to-core clock speed variations of a multi-core processor by manufacturing one or more cores (e.g., inner cores) of the multi-core processor using increased poly-silicon gate lengths as compared to one or more other cores (e.g., outer cores) of the multi-core processor. Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
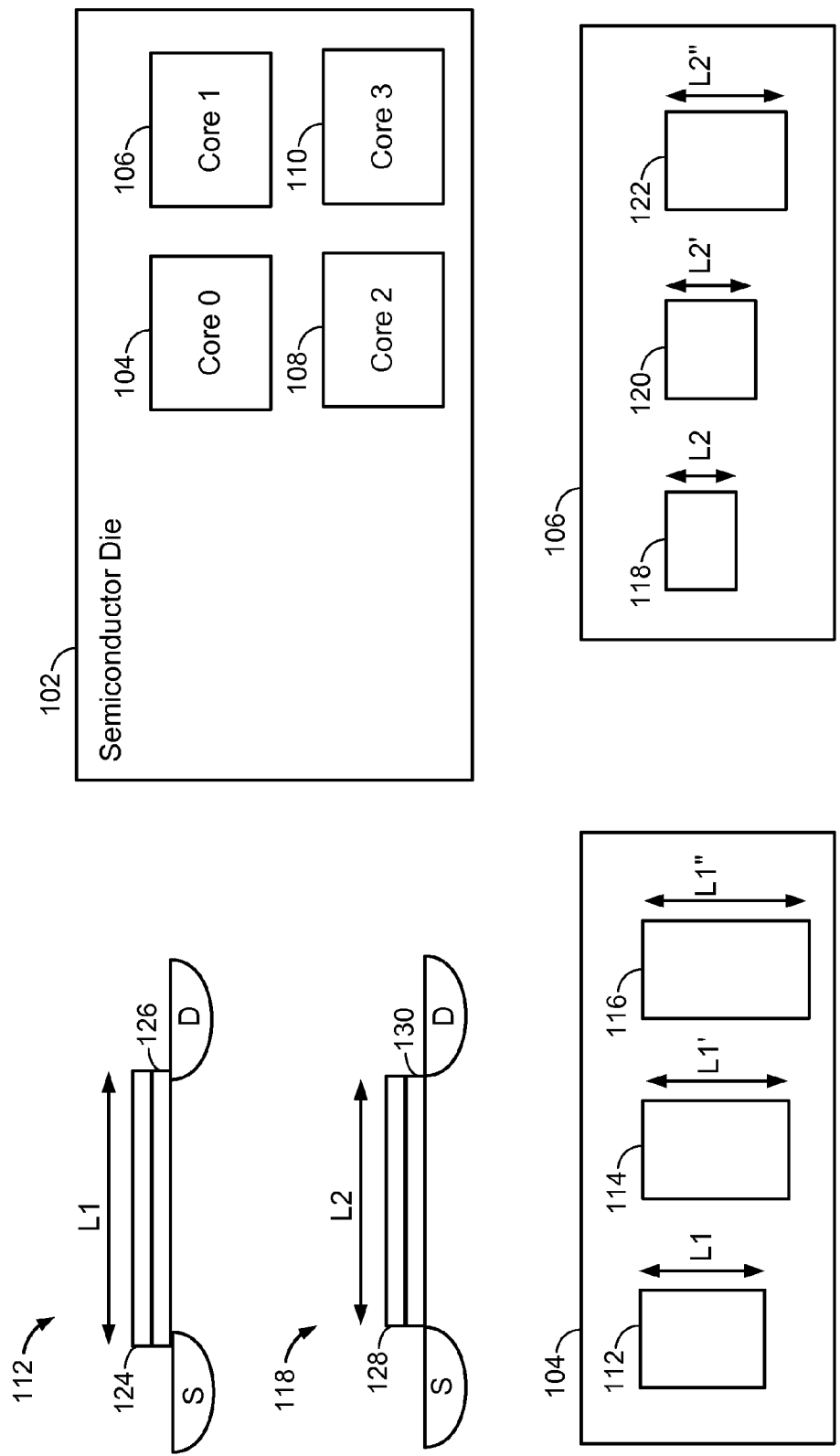
FIG. 1 is a diagram of a particular illustrative embodiment of a multi-core processor manufactured using differing gate lengths.

FIG. 1 illustrates a particular illustrative embodiment of a multi-core processor manufactured using different poly-silicon gate lengths. The multi-core processor may be manufactured as a semiconductor die 102 that includes a plurality of cores. For example, the semiconductor die 102 may include a first core 104, a second core 106, a third core 108, and a fourth core 110. Each of the cores 104-110 may include a plurality of transistors. The first core 104 and the third core 108 may be located closer to a center of the semiconductor die 102 as compared to the second core 106 and the fourth core 110, respectively. The first core 104 and the third core 108 may be referred to as inner cores, and the second core 106 and the fourth core 110 may be referred to as outer cores.

The semiconductor die 102 may be manufactured using a 28 nanometer (nm) process, as an illustrative, non-limiting example. Empirical data may indicate that the inner cores 104, 108 have higher clock speeds and higher leakage current than the outer cores 106, 110. The cores 104 and 108 may therefore be "upsized" by a particular amount as compared to the cores 106 and 110 to reduce leakage current variations and clock speed variations among the cores 104-110 without modifying device dimension other than gate length.

For example, the first core 104 may include a first transistor 112, a second transistor 114, and a third transistor 116. Each of the transistors 112-116 may have a different gate length (e.g., a poly-silicon gate length of a transistor). As an example, the first transistor 112 may have a gate length L1. The second transistor 114 may have a gate length L1' that is greater than the gate length L1. The third transistor 116 may have a gate length L1" that is greater than the gate length L1'. The second core 106 may include a fourth transistor 118, a fifth transistor 120, and a sixth transistor 122. Each of the transistors 118-122 may have a different gate length. For example, the fourth transistor 118 may have a gate length L2. The fifth transistor 120 may have a gate length L2' that is greater than the gate length L2. The sixth transistor 122 may have a gate length L2" that is greater than the gate length L2'. Gate lengths of transistors of the third core 108 may have the same gate lengths (e.g., the gate lengths L1-L1") as the gate lengths of corresponding transistors (e.g., the transistors 112-116) of the first core 104. Gate lengths of transistors of the fourth core 110 may have the same gate lengths (e.g., the gate lengths L2-L2") as the gate lengths of corresponding transistors (e.g., the transistors 118-122) of the second core 106.

Transistors of the first core 104 may be upsized by as compared to corresponding transistors of the second core 106 to reduce leakage current variations and/or clock speed variations. For example, the first transistor 112 and the fourth transistor 118 may be corresponding transistors. The first transistor 112 may include a source (S), a drain (D), and a first poly-silicon gate layer 124 that has the gate length L1. The first transistor 112 may also include a first oxide layer 126 that has the gate length L1. The fourth transistor 118 may include a second poly-silicon gate layer 128 that has the gate length L2. The fourth transistor 118 may also include a second oxide layer 130 that has the gate length L2. The gate length L1 may be upsized by 1 nm as compared to the gate length L2 (i.e., L1=L2+1 nm).

Transistors of the first core 104 may be upsized by the same amount as compared to the corresponding transistors of the second core 106. For example, the gate lengths L1, L1', and L1" may be upsized such that a difference between the gate length L1 and L2 is substantially the same as a difference between the gate length L1' and L2' and is substantially the same as a difference between the gate length L1" and L2". In a particular embodiment, the gate lengths L1, L1', and L1" are each upsized by 1 nm (i.e., L1=L2+1 nm, L1'=L2'+1 nm, L1"=L2"+1 nm). In another particular embodiment, the gate lengths L1, L1', and L1" are each upsized by 2 nm or another amount. The gate lengths L2, L2', and/or L2" may correspond to standard lengths of a poly-silicon gate layer and/or an oxide layer, and the gate lengths L1, L1', and/or L1" may correspond to an increased length as compared to the standard length. In a particular embodiment, upsizing the cores 104 and 108 by 1 nm (i.e., increasing gate lengths (L1, L1', and L1") of the cores 104 and 108 by 1 nm as compared gate lengths of to the cores 106 and 110) during manufacturing may reduce leakage current of the cores 104 and 108 by 5% as compared to manufacturing the cores 104 and 108 without such upsizing.

To determine the upsized gate lengths (e.g., the gate length L1, the gate length L1', and/or the gate length L1"), the inner cores (e.g., the first core 104 and the third core 108) and the outer cores (e.g., the second core 106 and the fourth core 110) may be manufactured on a first semiconductor die such that corresponding poly-silicon gates of transistors of the inner core and poly-silicon gates of the outer cores have the standard lengths (e.g., the first transistor 112 and the fourth transistor 118 have the gate length L2, the second transistor 114 and the fifth transistor 120 have the gate length L2', the third transistor 116 and the sixth transistor 122 have the gate length L2"). Performance parameters associated with the cores of the first semiconductor die may be compared to determine performance variations. For example, leakage current of the inner cores and leakage current of the outer cores may be compared to determine core-to-core leakage current variations (e.g., a leakage current of the first core 104 as compared to a leakage current of the second core 106 or a leakage current of the third core 108 as compared to a leakage current of the fourth core 110). As another example, clock speed of the inner cores and clock speed of the outer cores may be compared to determine core-to-core clock speed variations. The leakage current variations and/or the clock speed variations may be due to thermal effects and/or process variations. Based on the core-to-core leakage current variation and/or the core-to-core clock speed variation, the upsized gate lengths may be determined. For example, when the core-to-core leakage current variation and/or the core-to-core clock speed variation is within a first range (e.g., less than or equal to 5%), the upsized gate length is an increase of 1 nm relative to the standard length. When the core-to-core leakage current variation and/or the core-to-core clock speed variation is within a second range (e.g., more than 5%), the upsized gate length may be an increase of 2 nm relative to the standard length. The upsized gate lengths may be determined to reduce the leakage current variations and/or the clock speed variations.

For example, a leakage current variation between the first core 104 and the second core 106 may be 6 milli-amperes (mA) and a clock speed variation between the first core 104 and the second core 106 may be 40 megahertz (MHz). A leakage current variation between the third core 108 and the fourth core 110 may be 4 mA and a clock speed variation between the third core 108 and the fourth core 110 may be 30 MHz. Based on the leakage current variations and/or the clock speed variations, the upsized gate lengths may be determined to be greater than the corresponding standard lengths by 1 nanometer (nm) to reduce the leakage current variations and/or the clock speed variations. Thus, the poly-silicon gates of transistors of the inner cores may be universally increased ("upsized") by 1 nm in length when the inner cores and the outer cores are manufactured on a second semiconductor die. In another example, instead of upsizing the gates in the inner cores by the same amount (e.g., 1 nm) to have the upsized gate lengths in every inner core, each inner core may be individually upsized by a different amount. For example, the first core 104 may be upsized by 1 nm (e.g., gate gates in the first core 104 increased in length by 1 nm) and the third core 108 may be upsized by 2 nm.

By increasing the length of the poly-silicon gates of the corresponding transistors of the inner cores, leakage current of the inner cores due to the short channel effect may be reduced. Thus, the leakage current variations between the inner cores and the outer cores may be reduced. Further, by increasing the length of the poly-silicon gates of the corresponding transistors of the inner cores, a transit time (the amount of time a transistor takes to transfer a charge from source to drain) of a transistor of the inner cores may be increased. Thus, a switching capability of the transistor may be reduced and the clock speed of the inner cores may be reduced to reduce clock speed variations between inner cores and outer cores.

The semiconductor die 102 may be one of a plurality of semiconductor dies that is manufactured on a wafer. In a particular embodiment, cores that are located closer to the center of a corresponding semiconductor die in each of the plurality of semiconductor dies are upsized by the same amount or substantially the same amount across the wafer. For example, cores that are located closer to the center of a corresponding semiconductor die in each of the plurality of semiconductor dies may be upsized by 1 nm. In another particular embodiment, cores of a first semiconductor die and corresponding cores of a second semiconductor die may be upsized by different amounts based on locations of the first semiconductor die and the second semiconductor die on a wafer, as is described in FIG. 2. Although FIG. 1 illustrates that the transistors 112, 114, and 116 of the first core 104 have three different gate lengths and the transistors 114, 120, and 122 of the second core 106 have different gate lengths, it should be understood that the transistors of the first core 104 and the second core 106 may have more than three different gate lengths or fewer than three different gate lengths in other embodiments.

Because increased gate length may reduce leakage current and switching speed, core-to-core leakage current variations and/or core-to-core clock speed variations of semiconductor dies may be reduced by upsizing one or more cores of the semiconductor dies without upsizing one or more other cores of the semiconductor die. With reduced core-to-core leakage current variations and/or core-to-core clock speed variations, yield of the semiconductor dies may be enhanced. Upsizing may be performed by using a single mask modification to manufacture gates of the semiconductor dies. The modification of a single mask is a relatively small change in a manufacturing process of semiconductor dies. Thus, using a single mask modification to perform core upsizing may reduce manufacturing complexity as compared to a complete redesign of the manufacturing process.

Figure 2:
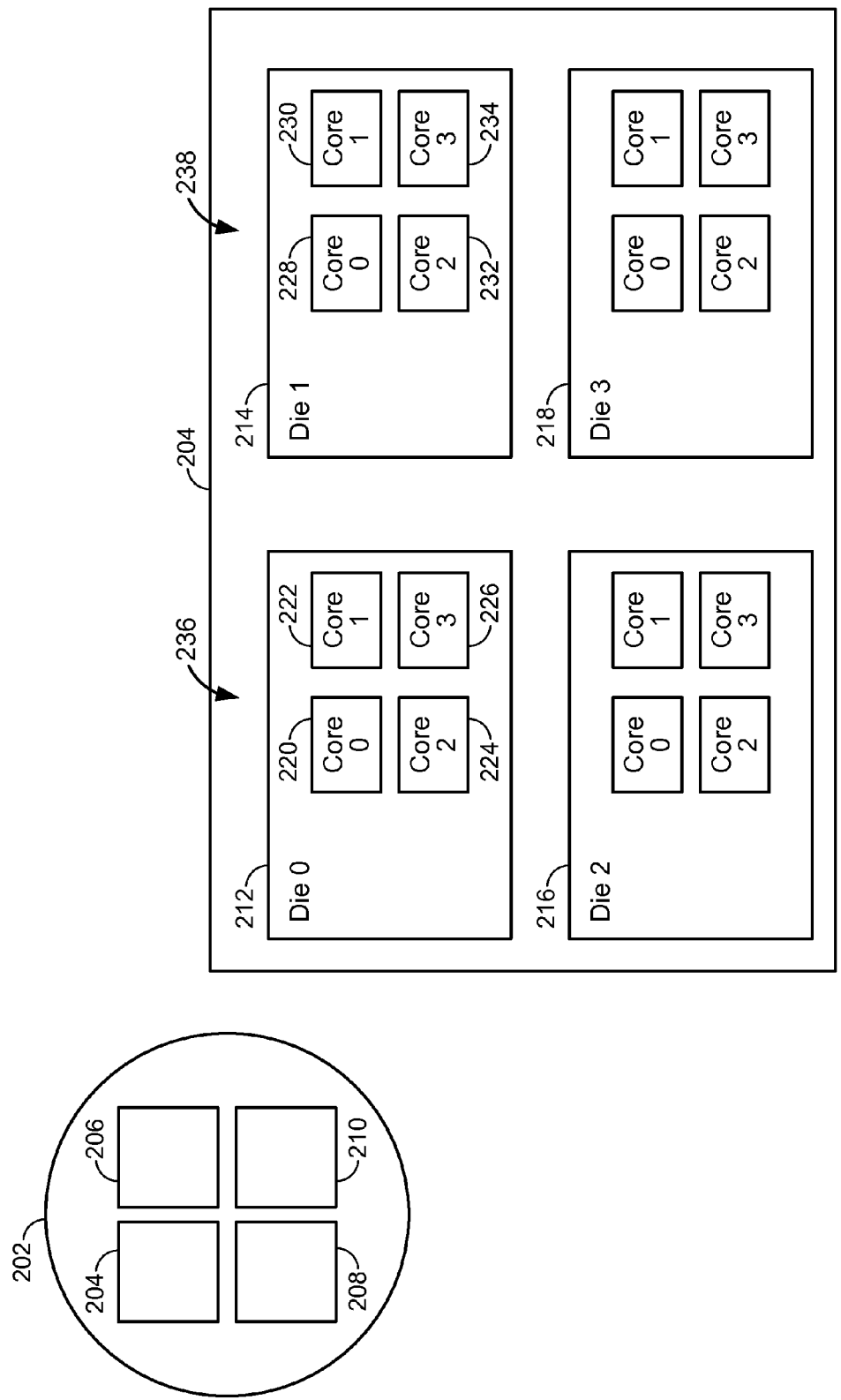
FIG. 2 is a diagram of another particular illustrative embodiment of a multi-core processor manufactured using differing gate lengths.

FIG. 2 illustrates a wafer 202 that includes a plurality of reticles including a first reticle 204, a second reticle 206, a third reticle 208, and a fourth reticle 210. Each of the reticles 204-210 may correspond to a specific portion of the wafer 202. Semiconductor devices such as multi-core processors may be formed as semiconductor dies within each of the reticle 204-210. For example, a plurality of semiconductor dies including a first semiconductor die 212, a second semiconductor die 214, a third semiconductor die 216, and a fourth semiconductor die 218 may be manufactured in the first reticle 204 using a mask. Copies of the semiconductor dies 212-218 may be formed in the reticles 206-210. Although FIG. 2 illustrates four semiconductor dies in the reticle 204, it should be understood that any number of semiconductor dies may be manufactured in a reticle 204.

Each of the semiconductor dies 204-210 may include a plurality of cores. For example, the first semiconductor die 212 may include a first core 220, a second core 222, a third core 224, and a fourth core 226. The second semiconductor die 214 may include a fifth core 228, a sixth core 230, a seventh core 232, and an eighth core 234.

The amount of upsizing (if any) of each core of each of the semiconductor dies 212-218 may be individually determined by empirical data related to a manufacturing process of the wafer 202. The empirical data may include process variations data and/or performance data of cores (e.g., leakage current of a core, clock speed of a core, etc.) that are subject to manufacturing process variations. To illustrate, cores of the first semiconductor die 212 may be upsized by a different amount than cores of the second semiconductor die 214, cores of the third semiconductor die 216, and/or cores of the fourth semiconductor die 218. For example, a first iteration of the wafer 202 that includes the semiconductor dies 212-218 in the reticle 204 may be manufactured. Poly-silicon gate layers and/or oxide layers of transistors of cores of the semiconductor dies 212-218 may be manufactured according a single length (e.g., the gate length L1) in the first iteration. Core-to-core leakage current variations and/or core-to-core clock speed variations of each of the semiconductor dies 212-218 in the first iteration may be measured to generate the empirical data. The core-to-core leakage current variations and/or the core-to-core clock speed variations may be due to manufacturing process variations.

Based on the empirical data, the amount of upsizing of each core of each of the semiconductor dies 212-218 may be individually determined. The empirical data may indicate that the core-to-core leakage current variations and/or the core-to-core clock speed variations depend on locations of the semiconductor dies 212-218 in the reticle 204. For example, cores of semiconductor dies on a left reticle-field 236 of the reticle 204 (e.g., the first semiconductor die 212 and the third semiconductor die 216) may have different core-to-core leakage current variations and/or core-to-core clock speed variations than cores of semiconductor dies on a right reticle-field 238 of the reticle 204 (e.g., the second semiconductor die 214 and the fourth semiconductor die 218).

As an example, the empirical data may indicate that, on the left reticle-field 236, inner cores (e.g., the first core 220 and the third core 224) of the first semiconductor die 212 may have leakage current that is 6 mA higher than outer cores (e.g., the second core 222 and the fourth core 226) of the first semiconductor die 212. The empirical data may also indicate that, on the right reticle-field 238, inner cores (e.g., the fifth core 228 and the seventh core 232) of the second semiconductor die 214 may have leakage current that is 10 mA higher than outer cores (e.g., the sixth core 230 and the eighth core 234). Based on the empirical data, during manufacturing of a second iteration of the wafer 202, the inner cores of the first semiconductor die 212 may be upsized by 1 nm, the inner cores of the second semiconductor die 214 may be upsized by 2 nm, and the outer cores of the first semiconductor die 212 and the second semiconductor die 214 may be formed using the standard lengths (e.g., the gate lengths of L2-L2" of FIG. 1) to reduce different core-to-core leakage current variations and/or to reduce the core-to-core clock speed variations. In another example, the inner cores of the second semiconductor die 214 may be upsized in the second iteration of the wafer 202 while the inner cores of the first semiconductor die 212 may remain unchanged in the second iteration, or vice versa.

In another example, some or all cores (the inner cores and/or the outer cores) of a semiconductor die may be individually upsized by a different amount based on the empirical data to further reduce core-to-core leakage current variations and/or the core-to-core clock speed variations. For example, the empirical data may indicate that the first core 220 may have a leakage current that is 4 mA higher than the second core 222 and that the third core 224 may have a leakage current that is 8 mA higher than the fourth core 226. Based on the empirical data, the first core 220 may be upsized by 1 nm (e.g., gate lengths of transistors of the first core 220 are increased by 1 nm relative to gate lengths of corresponding transistors of the second core 222) and the third core 224 may be upsized by 2 nm (e.g., gate lengths of transistors of the third core 224 are increased by 2 nm relative to gate lengths of corresponding transistors of the fourth core 226). The second core 222 and/or the fourth core 226 may also be upsized based on the empirical data.

Although FIGS. 1-2 illustrate that poly-silicon gate lengths of inner cores (e.g., the first core 104 of FIG. 1, the first core 220 of FIG. 2, etc.) of a semiconductor die may be upsized relative to poly-silicon gate lengths of corresponding outer cores (e.g., the second core 106, the second core 222, etc.) of the semiconductor die, it should be understood that the poly-silicon gate lengths of the outer cores may be upsized relative to the poly-silicon gate lengths of the inner cores when the outer cores have greater leakage current and/or faster clock speed than the inner cores.

Figure 3:
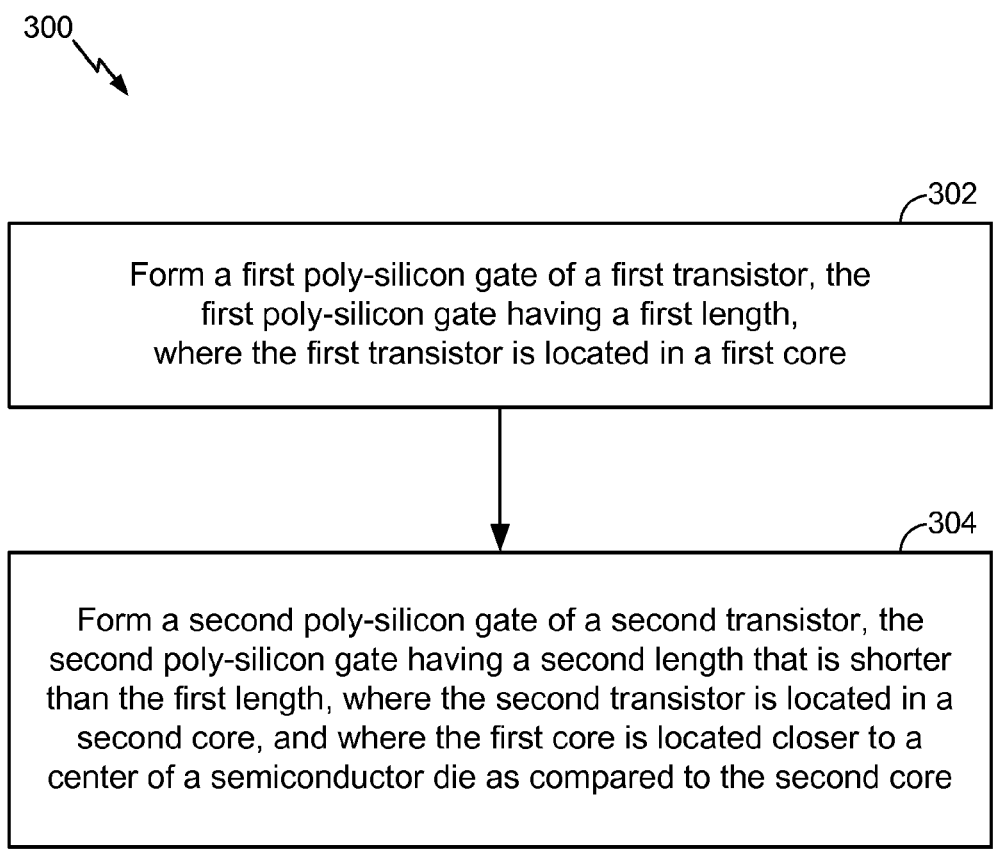
FIG. 3 is a flow chart of a particular illustrative embodiment of a method of manufacturing a multi-core processor using differing gate lengths.

FIG. 3 illustrates a flow chart of a particular illustrative embodiment of a method 300 of manufacturing a multi-core processor using different poly-silicon gate lengths. The method 300 includes forming a first poly-silicon gate of a first transistor, at 302. The first poly-silicon gate has a first length, and the first transistor is located in a first core. For example, referring to FIG. 1, the first transistor 112 may include the first poly-silicon gate layer 124 that has the gate length L1.

The method 300 also includes forming a second poly-silicon gate of a second transistor, at 304. The second poly-silicon gate has a second length that is shorter than the first length. The second transistor is located in a second core, and the first core is located closer to a center of a semiconductor die as compared to the second core. For example, referring to FIG. 1, the fourth transistor 118 may include the second poly-silicon gate layer 128 that has the gate length L2. The gate length L1 may be upsized by 1 nm as compared to the gate length L2. Thus, the method 300 may enable a semiconductor die that includes a plurality of cores to be manufactured using upsized gate lengths. The use of upsized gate lengths may reduce core-to-core leakage current variations and/or core-to-core clock speed variations.

In a particular embodiment, the method 300 includes forming a third poly-silicon gate of a third transistor of a third core. The third poly-silicon gate has the first length. For example, referring to FIG. 1, the gate lengths of transistors of the third core 108 may have the same gate lengths (e.g., the gate lengths L1-L1") as the gate lengths of corresponding transistors (e.g., the transistors 112-116) of the first core 104. The method 300 may also include forming a fourth poly-silicon gate of a fourth transistor of a fourth core. The fourth poly-silicon gate has the second length. The third core is located closer to the center of the semiconductor die as compared to the fourth core. For example, referring to FIG. 1, the gate lengths of transistors of the fourth core 110 may have the same gate lengths (e.g., the gate lengths L2-L2") as the gate lengths of corresponding transistors (e.g., the transistors 118-122) of the second core 106. The third core 108 may be located closer to a center of the semiconductor die 102 as compared to the fourth core 110.

In another particular embodiment, the method 300 includes forming a third poly-silicon gate of a third transistor located in a third core, and forming a fourth poly-silicon gate of a fourth transistor located in a fourth core. The third poly-silicon gate has a third length, and the fourth poly-silicon gate has a fourth length. The first length is determined by increasing the second length by a first amount. The third length is determined by increasing the fourth length by a second amount. The first amount is different from the second amount. The first transistor and the second transistor are corresponding transistors, and the third transistor and the fourth transistor are corresponding transistors. For example, referring to FIG. 2, based on the empirical data, the first core 220 may be upsized by 1 nm (e.g., gate lengths of transistors of the first core 220 are increased by 1 nm relative to gate lengths of corresponding transistors of the second core 222) and the third core 224 may be upsized by 2 nm (e.g., gate lengths of transistors of the third core 224 are increased by 2 nm relative to gate lengths of corresponding transistors of the fourth core 226).

In another particular embodiment, the method 300 includes, prior to forming the first poly-silicon gate using the first length, forming the first core and the second core using the second length. For example, referring to FIG. 1, the inner cores (e.g., the first core 104 and the third core 108) and the outer cores (e.g., the second core 106 and the fourth core 110) may be manufactured on a first semiconductor die such that corresponding poly-silicon gates of transistors of the inner core and poly-silicon gates of the outer cores have the standard lengths (e.g., the first transistor 112 and the fourth transistor 118 have the gate length L2, the second transistor 114 and the fifth transistor 120 have the gate length L2', the third transistor 116 and the sixth transistor 122 have the gate length L2").

The method 300 may also include, prior to forming the first poly-silicon gate using the first length, measuring a first performance parameter associated with the first core and measuring a second performance parameter associated with the second core. For example, referring to FIG. 1, the leakage current of the inner cores and the leakage current of the outer cores may be compared to determine core-to-core leakage current variations (e.g., a leakage current of the first core 104 as compared to a leakage current of the second core 106 or a leakage current of the third core 108 as compared to a leakage current of the fourth core 110). As another example, the clock speed of the inner cores and the clock speed of the outer cores may be compared to determine core-to-core clock speed variations.

The method 300 may further include, prior to forming the first poly-silicon gate using the first length, determining the first length based on a difference between the first performance parameter and the second performance parameter. For example, referring to FIG. 1, based on the core-to-core leakage current variation and/or the core-to-core clock speed variation, the upsized gate lengths may be determined, such as by having a first value when the difference is less than the first threshold and having a second value when the difference is greater than or equal to the second threshold.

Figure 4:
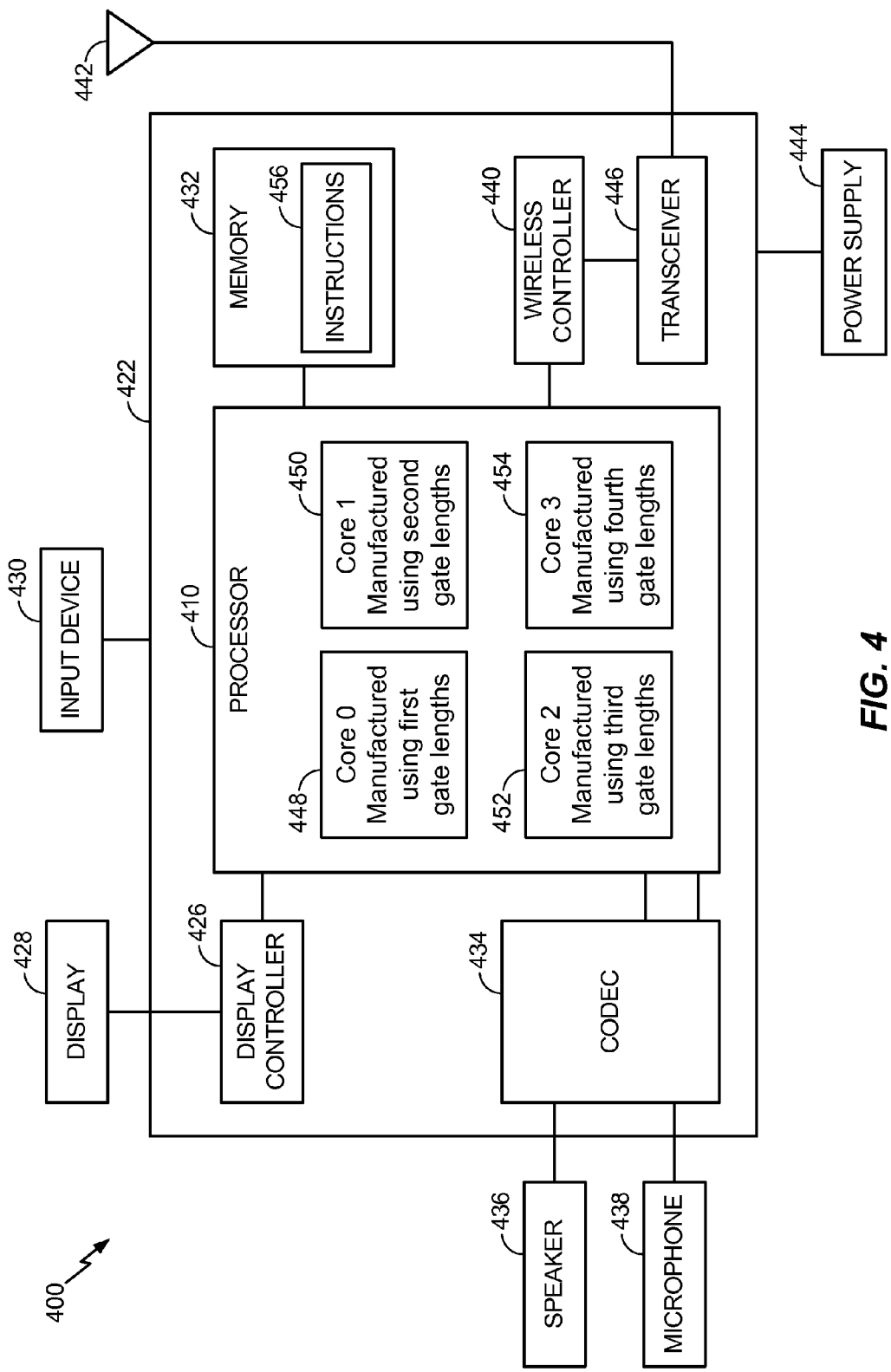
FIG. 4 is a block diagram of portable device including a multi-core processor manufactured using differing gate lengths.

FIG. 4 illustrates a communication device 400 that includes a processor having a plurality of cores (e.g., the semiconductor die 102 of FIG. 1, any of the semiconductor dies 212-218 of FIG. 2) with different gate lengths. The method described in FIG. 3, or certain portions thereof, may be used to manufacture components of the communication device 400.

The communication device 400 includes a processor 410, such as a digital signal processor (DSP) or a multi-core processor, coupled to a memory 432. The memory 432 may be a non-transitory tangible computer-readable and/or processor-readable storage device that stores instructions 456. The instructions 456 may be executable by the processor 410. The processor 410 may include a plurality of cores including a first core 448 manufactured using first gate lengths (e.g., the gate length L1 of FIG. 1, the gate length L1', the gate length L1", or a combination thereof), a second core 450 manufactured using second gate lengths (e.g., the gate length L2, the gate length L2', the gate length L2", or a combination thereof), a third core 452 manufactured using third gate lengths, and a fourth core 454 manufactured using fourth gate lengths.

The first core 448 and/or the third core 452 may correspond to inner core(s) of the processor 410 (e.g., the first core 104 and/or the third core 108 of FIG. 1, the first core 220 and/or the third core 224 of FIG. 2, the fifth core 228 and/or the seventh core 232 of FIG. 2). The second core 450 and/or the fourth core 454 may correspond to outer core(s) of the processor 410 (e.g., the second core 106 and/or the fourth core 110, the second core 222 and/or the fourth core 226, the sixth core 230 and/or the eighth core 234). In a particular embodiment, the first gate lengths correspond to gate lengths that are increased relative to the second gate lengths. In another particular embodiment, the third gate lengths correspond to gate lengths that are increased relative to the fourth gate lengths. In another particular embodiment, the first core 448 and the third core 452 are upsized by the same amount. In another particular embodiment, the first core 448 and the third core 452 are each upsized by a different amount.

FIG. 4 shows that the communication device 400 may also include a display controller 426 that is coupled to the processor 410 and to a display device 428. A coder/decoder (CODEC) 434 can also be coupled to the processor 410. A speaker 436 and a microphone 438 can be coupled to the CODEC 434. FIG. 4 also shows a wireless controller 440 coupled to the processor 410. The wireless controller 440 is in communication with an antenna 442 via a transceiver 446. The wireless controller 440, the transceiver 446, and the antenna 442 may represent a wireless interface that enables wireless communication by the communication device 400. The communication device 400 may include numerous wireless interfaces, where different wireless networks are configured to support different networking technologies or combinations of networking technologies (e.g., Bluetooth low energy, Near-field communication, Wi-Fi, cellular, etc.).

In a particular embodiment, the processor 410, the display controller 426, the memory 432, the CODEC 434, the wireless controller 440, and the transceiver 446 are included in a system-in-package or system-on-chip device 422. In a particular embodiment, an input device 430 and a power supply 444 are coupled to the system-on-chip device 422. Moreover, in a particular embodiment, as illustrated in FIG. 4, the display device 428, the input device 430, the speaker 436, the microphone 438, the antenna 442, and the power supply 444 are external to the system-on-chip device 422. However, each of the display device 428, the input device 430, the speaker 436, the microphone 438, the antenna 442, and the power supply 444 can be coupled to a component of the system-on-chip device 422, such as an interface or a controller.

In conjunction with the described embodiments, an apparatus includes first means for processing. The first means for processing includes a first transistor. The first transistor includes a first poly-silicon gate and the first poly-silicon gate has a first length. For example, the first means for processing may include the first core 104 of FIG. 1, the third core 108, the first core 220 of FIG. 2, the third core 224, the fifth core 228, the seventh core 232, a core (e.g., an inner core, a core having a greater leakage current and/or faster clock speed relative to a corresponding core) of the third semiconductor die 216, a core (e.g., an inner core, a core having greater leakage current and/or faster clock speed relative to a corresponding core) of the fourth semiconductor die 218, one or more devices configured to process data and/or instructions executable by a processor, or a combination thereof.

The apparatus also includes second means for processing. The second means for processing includes a second transistor. The second transistor includes a second poly-silicon gate having a second length that is shorter than the first length. The first means for processing is located closer to a center of a semiconductor die than the second means for processing. For example, the second means for processing may include the second core 106 of FIG. 1, the fourth core 110, the second core 222 of FIG. 2, the fourth core 226, the sixth core 230, the eighth core 234, a core (e.g., an outer core, a core having less leakage current and/or slower clock speed relative to a corresponding core) of the third semiconductor die 216, a core (e.g., an outer core, a core having less leakage current and/or slower clock speed relative to a corresponding core) of the fourth semiconductor die 218, one or more devices configured to process data and/or instructions executable by a processor, or a combination thereof.

Figure 5:
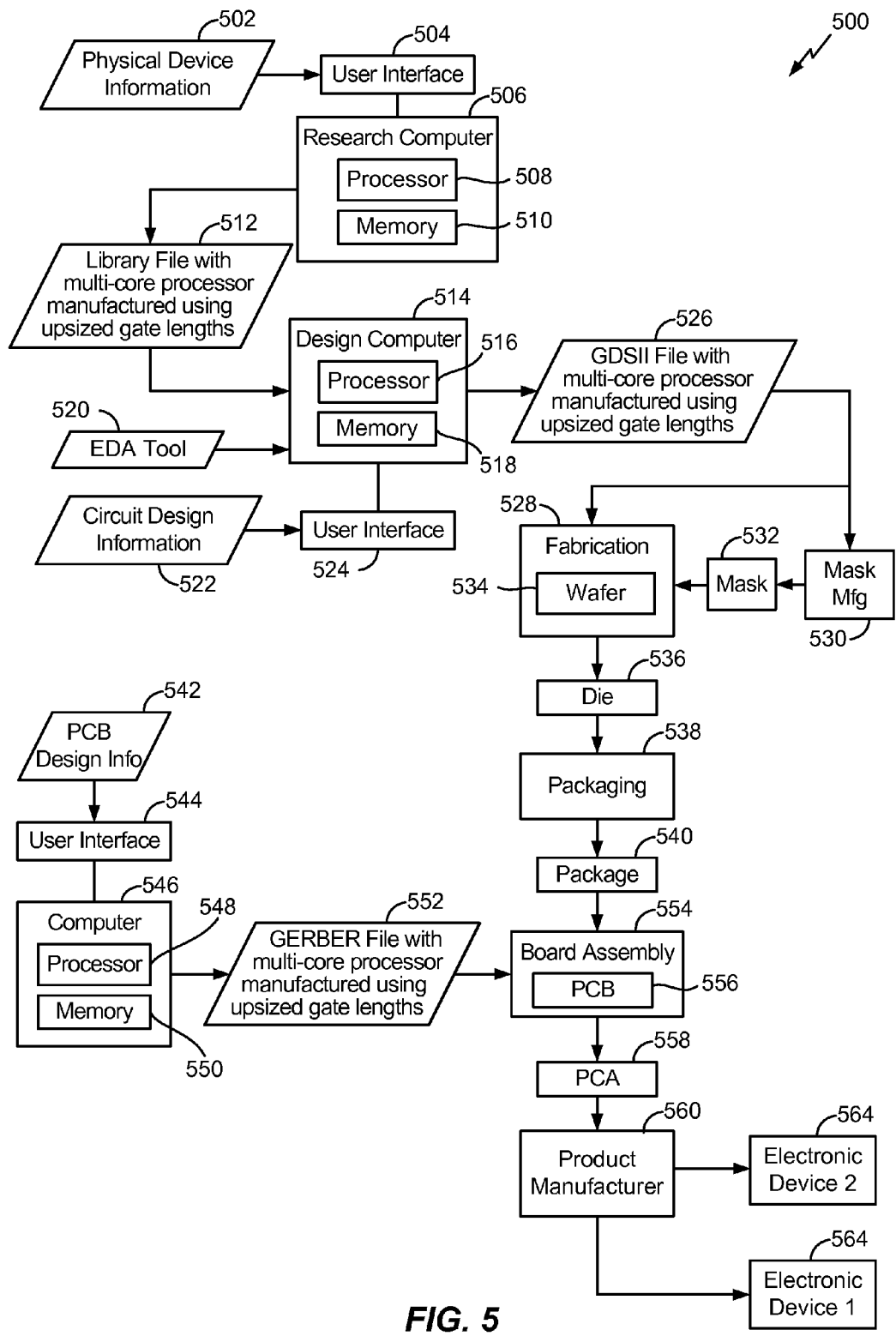
FIG. 5 is a data flow diagram of a particular illustrative embodiment of a manufacturing process to manufacture electronic devices that include a multi-core processor manufactured using differing gate lengths.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 5 depicts a particular illustrative embodiment of an electronic device manufacturing process 500.

Physical device information 502 is received at the manufacturing process 500, such as at a research computer 506. The physical device information 502 may include design information representing at least one physical property of a semiconductor device, such as the semiconductor die 102 of FIG. 1, any of the semiconductor dies 212-218 of FIG. 2, the processor 410 of FIG. 4, or a combination thereof. For example, the physical device information 502 may include physical parameters, material characteristics, and structure information that is entered via a user interface 504 coupled to the research computer 506. The research computer 506 includes a processor 508, such as one or more processing cores, coupled to a computer readable medium such as a memory 510. The memory 510 may store computer readable instructions that are executable to cause the processor 508 to transform the physical device information 502 to comply with a file format and to generate a library file 512.

In a particular embodiment, the library file 512 includes at least one data file including the transformed design information. For example, the library file 512 may include a library of semiconductor devices including a device that includes the semiconductor die 102 of FIG. 1, any of the semiconductor dies 212-218 of FIG. 2, the processor 410 of FIG. 4, or any combination thereof, that is provided for use with an electronic design automation (EDA) tool 520.

The library file 512 may be used in conjunction with the EDA tool 520 at a design computer 514 including a processor 516, such as one or more processing cores, coupled to a memory 518. The EDA tool 520 may be stored as processor executable instructions at the memory 518 to enable a user of the design computer 514 to design a circuit including the semiconductor die 102 of FIG. 1, any of the semiconductor dies 212-218 of FIG. 2, the processor 410 of FIG. 4, or a combination thereof of the library file 512. For example, a user of the design computer 514 may enter circuit design information 522 via a user interface 524 coupled to the design computer 514. The circuit design information 522 may include design information representing at least one physical property of a semiconductor device, such as the semiconductor die 102 of FIG. 1, any of the semiconductor dies 212-218 of FIG. 2, the processor 410 of FIG. 4, or any combination thereof. To illustrate, the circuit design property may include identification of particular circuits and relationships to other elements in a circuit design, positioning information, feature size information, interconnection information, or other information representing a physical property of a semiconductor device.

The design computer 514 may be configured to transform the design information, including the circuit design information 522, to comply with a file format. To illustrate, the file formation may include a database binary file format representing planar geometric shapes, text labels, and other information about a circuit layout in a hierarchical format, such as a Graphic Data System (GDSII) file format. The design computer 514 may be configured to generate a data file including the transformed design information, such as a GDSII file 526 that includes information describing the semiconductor die 102 of FIG. 1, any of the semiconductor dies 212-218 of FIG. 2, the processor 410 of FIG. 4, or a combination thereof in addition to other circuits or information. To illustrate, the data file may include information corresponding to a system-on-chip (SOC) that includes the semiconductor die 102 of FIG. 1, any of the semiconductor dies 212-218 of FIG. 2, the processor 410 of FIG. 4, or a combination thereof and that also includes additional electronic circuits and components within the SOC.

The GDSII file 526 may be received at a fabrication process 528 to manufacture the semiconductor die 102 of FIG. 1, any of the semiconductor dies 212-218 of FIG. 2, the processor 410 of FIG. 4, or a combination thereof according to transformed information in the GDSII file 526. The fabrication process 528 may be controlled by a processor that accesses processor executable instructions stored in a memory. The instructions may be executable by the processor to perform different stages of the fabrication process 528. The processor may be integrated in a device selected from the group consisting of a communications device, a cell phone, a smart phone, a tablet computer, a laptop computer, a personal digital assistant (PDA), and a computer.

For example, the fabrication process 528 may include formations of a first poly-silicon gate of a first transistor and a second poly-silicon gate of a second transistor. The first poly-silicon gate has a first length and is located in a first core. The second poly-silicon gate has a second length that is shorter than the first length and is located in a second core. The first core is located closer to a center of a semiconductor die as compared to the second core. Based on the processor executable instructions, the processor may send commands to a semiconductor fabrication machine during a deposition stage to instruct the semiconductor fabrication machine to deposit a poly-silicon layer (e.g., via a chemical vapor deposition process) onto a substrate that is to be poly-silicon gates of the first transistor and the second transistor. The processor may send commands to the semiconductor fabrication machine during a patterning stage to perform etching to form the poly-silicon gates such that the poly-silicon gates of the first transistor have upsized lengths (e.g., the gate lengths L1-L1" of FIG. 1) and poly-silicon gates of the second transistor have standard lengths (e.g., the gate lengths L2-L2").

The fabrication process 528 may also include, prior to forming the first poly-silicon gate using the first length, forming the first core and the second core using the second length. For example, based on the processor executable instructions, the processor may send commands to the semiconductor fabrication machine to fabricate the first core and the second core using the standard lengths (via a deposition process, an etching process, etc.).

The fabrication process 528 may further include, prior to forming the first poly-silicon gate using the first length, measuring a first performance parameter associated with the first core. For example, based on the processor executable instructions, the processor may send commands to the semiconductor fabrication machine or a measuring machine to measure one or more performance parameters of the first core (e.g., leakage current, clock speed, etc.). The measured one or more performance parameters may be stored in the memory, in a memory of the semiconductor fabrication machine, in a memory of the measuring machine, or a combination thereof.

The fabrication process 528 may further include, prior to forming the first poly-silicon gate using the first length, measuring a second performance parameter associated with the second core. For example, based on the processor executable instructions, the processor may send commands to the semiconductor fabrication machine or the measuring machine to measure one or more performance parameter of the second core (e.g., leakage current, clock speed, etc.). The measured one or more performance parameters may be stored in the memory, in a memory of the semiconductor fabrication machine, in a memory of the measuring machine, or a combination thereof.

The fabrication process 528 may further include, prior to forming the first poly-silicon gate using the first length, determining the first length based on a difference between the first performance parameter and the second performance parameter. For example, based on the processor executable instructions, the processor may calculate a difference between the measured one or more performance parameters of the first core and the corresponding measured one or more performance parameters of the second core. Alternatively, the processor may send command to the semiconductor fabrication machine or the measuring machine to calculate the difference. Using the difference, the processor may determine the first length (e.g., the gate length L1, the gate length L1', the gate length L1", or a combination thereof) by adding an offset to a corresponding standard length (e.g., the gate length L2, the gate length L2', the gate length L2", or a combination). The processor may look up the offset in a lookup table or may compute the offset according to a model. Alternatively, the processor may instruct the semiconductor fabrication machine or the measuring machine to determine the first length (e.g., by using the lookup table).

As another example of the fabrication process 528, a device manufacture process may include providing the GDSII file 526 to a mask manufacturer 530 to create one or more masks, such as masks to be used with photolithography processing, illustrated as a representative mask 532. The mask 532 may be used during the fabrication process 528 to generate one or more wafers 534, which may be tested and separated into dies, such as a representative die 536. The die 536 includes a circuit including a device that includes the semiconductor die 102 of FIG. 1, any of the semiconductor dies 212-218 of FIG. 2, the processor 410 of FIG. 4, or a combination thereof.

The device manufacture process may manufacture multiple iterations of the die 536 to determine the upsized gate lengths. For example, the mask manufacturer 530 may create two iterations of the mask 532. A first iteration of the mask 532 may be created such that cores of the die 536 have the standard lengths (e.g., the gate lengths L2-L2"). A first iteration of the die 536 may be manufactured using the first iteration of the mask 532. Performance parameters of cores of first iteration of the die 536 may be measured to determine performance parameter variations (e.g., core-to-core leakage current variations, core-to-core clock speed variations, etc.). Based on the performance parameter variations, upsized gate lengths may be determined. For example, the upsized gate lengths may be determined by looking up an offset value in a lookup table, or computing the offset value according to a model, based on the performance parameter variations (e.g., when the core-to-core leakage current variation is less than 5%, the offset value is 1 nm).

A second iteration of the mask 532 may be created such that one or more cores (e.g., inner cores) of the die 536 may be created using upsized gate lengths and one or more cores (e.g., outer cores) of the die 536 may be created using the standard gate lengths. A second iteration of the die 536 may be manufactured using the second iteration of the mask 532.

The die 536 (e.g., the second iteration of the die 536) may be provided to a packaging process 538 where the die 536 is incorporated into a representative package 540. For example, the package 540 may include the single die 536 or multiple dies, such as a system-in-package (SiP) arrangement. The package 540 may be configured to conform to one or more standards or specifications, such as Joint Electron Device Engineering Council (JEDEC) standards.

Information regarding the package 540 may be distributed to various product designers, such as via a component library stored at a computer 546. The computer 546 may include a processor 548, such as one or more processing cores, coupled to a memory 550. A printed circuit board (PCB) tool may be stored as processor executable instructions at the memory 550 to process PCB design information 542 received from a user of the computer 546 via a user interface 544. The PCB design information 542 may include physical positioning information of a packaged semiconductor device on a circuit board, the packaged semiconductor device corresponding to the package 540 including the semiconductor die 102 of FIG. 1, any of the semiconductor dies 212-218 of FIG. 2, the processor 410 of FIG. 4, or a combination thereof.

The computer 546 may be configured to transform the PCB design information 542 to generate a data file, such as a GERBER file 552 with data that includes physical positioning information of a packaged semiconductor device on a circuit board, as well as layout of electrical connections such as traces and vias, where the packaged semiconductor device corresponds to the package 540 including the semiconductor die 102 of FIG. 1, any of the semiconductor dies 212-218 of FIG. 2, the processor 410 of FIG. 4, or a combination thereof. In other embodiments, the data file generated by the transformed PCB design information may have a format other than a GERBER format.

The GERBER file 552 may be received at a board assembly process 554 and used to create PCBs, such as a representative PCB 556, manufactured in accordance with the design information stored within the GERBER file 552. For example, the GERBER file 552 may be uploaded to one or more machines to perform various steps of a PCB production process. The PCB 556 may be populated with electronic components including the package 540 to form a representative printed circuit assembly (PCA) 558.

The PCA 558 may be received at a product manufacture process 560 and integrated into one or more electronic devices, such as a first representative electronic device 562 and a second representative electronic device 564. As an illustrative, non-limiting example, the first representative electronic device 562, the second representative electronic device 564, or both, may be selected from the group of mobile phones, smart phones, tablet computers, laptop computers, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof, into which the semiconductor die 102 of FIG. 1, any of the semiconductor dies 212-218 of FIG. 2, the processor 410 of FIG. 4, or a combination thereof is integrated. As another illustrative, non-limiting example, one or more of the electronic devices 562 and 564 may be remote units such a set top box, a music player, a video player, an entertainment unit, a navigation device, a communications device, a personal digital assistant (PDA), a fixed location data unit, a computer, or a combination thereof into which the semiconductor die 102 of FIG. 1, any of the semiconductor dies 212-218 of FIG. 2, the processor 410 of FIG. 4, or a combination thereof is integrated. Although FIG. 5 illustrates remote units according to teachings of the disclosure, the disclosure is not limited to these illustrated units. Embodiments of the disclosure may be suitably employed in any device which includes active integrated circuitry including memory and on-chip circuitry.

A device that includes the semiconductor die 102 of FIG. 1, any of the semiconductor dies 212-218 of FIG. 2, the processor 410 of FIG. 4, or a combination thereof may be fabricated, processed, and incorporated into an electronic device, as described in the illustrative process 500. One or more aspects of the embodiments disclosed with respect to FIGS. 1-4 may be included at various processing stages, such as within the library file 512, the GDSII file 526, and the GERBER file 552, as well as stored at the memory 510 of the research computer 506, the memory 518 of the design computer 514, the memory 550 of the computer 546, the memory of one or more other computers or processors (not shown) used at the various stages, such as at the board assembly process 554, and also incorporated into one or more other physical embodiments such as the mask 532, the die 536, the package 540, the PCA 558, other products such as prototype circuits or devices (not shown), or any combination thereof. Although various representative stages of production from a physical device design to a final product are depicted, in other embodiments fewer stages may be used or additional stages may be included. Similarly, the process 500 may be performed by a single entity or by one or more entities performing various stages of the process 500.

It should be understood that any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be employed or that the first element must precede the second element in some manner. Also, unless stated otherwise a set of elements may comprise one or more elements.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

As used herein, a phrase referring to "at least one of" a list of items refers to any combination of those items, including single members. As an example, "at least one of: a, b, or c" is intended to cover: a, b, c, a-b, a-c, b-c, and a-b-c.

Various illustrative components, blocks, configurations, modules, circuits, and steps may have been described above generally in terms of their functionality. Whether such functionality is implemented as hardware or processor executable instructions depends upon the particular application and design constraints imposed on the overall system. Additionally, the various operations of methods described above (e.g., any operation illustrated in FIGS. 3 and 5) may be performed by any suitable means capable of performing the operations, such as various hardware and/or processor executable software component(s), circuits, and/or module(s). Skilled artisans may implement the described functionality in varying ways for each particular application, but such implementation decisions should not be interpreted as causing a departure from the scope of the present disclosure.

Those of skill in the art would further appreciate that the various illustrative logical blocks, configurations, modules, circuits, and algorithm steps described in connection with the present disclosure may be implemented or performed with a general purpose processor, a digital signal processor (DSP), an application specific integrated circuit (ASIC), a field programmable gate array (FPGA), a programmable logic device (PLD), discrete gate or transistor logic, discrete hardware components (e.g., electronic hardware), computer software executed by a processor, or any combination thereof designed to perform the functions described herein. A general purpose processor may be a microprocessor, but in the alternative, the processor may be any commercially available processor, controller, microcontroller or state machine. A processor may also be implemented as a combination of computing devices, e.g., a combination of a DSP and a microprocessor, a plurality of microprocessors, one or more microprocessors in conjunction with a DSP core, or any other such configuration.

In one or more aspects, the functions described may be implemented in hardware, software, firmware, or any combination thereof. If implemented in software, the functions may be stored as one or more computer executable instructions or code on a computer-readable medium. Computer-readable media includes computer readable storage media and communication media including any medium that facilitates transfer of computer program data from one place to another. A storage media may be any available media that can be accessed by a computer. By way of example, and not limitation, such computer readable storage media can include random access memory (RAM), read-only memory (ROM), programmable read-only memory (PROM), erasable PROM (EPROM), electrically erasable PROM (EEPROM), register(s), hard disk, a removable disk, a compact disc read-only memory (CD-ROM), other optical disk storage, magnetic disk storage, magnetic storage devices, or any other medium that can be used to store program code in the form of instructions or data and that can be accessed by a computer. In the alternative, the computer-readable media (e.g., a storage medium) may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

Also, any connection is properly termed a computer-readable medium. For example, if software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), and floppy disk where disks usually reproduce data magnetically, while discs reproduce data optically with lasers. Thus, in some aspects computer readable medium may include a non-transitory computer readable medium (e.g., tangible media). Combinations of the above should also be included within the scope of computer-readable media.

The methods disclosed herein include one or more steps or actions. The method steps and/or actions may be interchanged with one another without departing from the scope of the claims. In other words, unless a specific order of steps or actions is specified, the order and/or use of specific steps and/or actions may be modified without departing from the scope of the disclosure.

Certain aspects may include a computer program product for performing the operations presented herein. For example, a computer program product may include a computer-readable storage medium having instructions stored (and/or encoded) thereon, the instructions being executable by one or more processors to perform the operations described herein. The computer program product may include packaging material.

Further, it should be appreciated that modules and/or other appropriate means for performing the methods and techniques described herein can be downloaded and/or otherwise obtained by a user terminal and/or base station as applicable. Alternatively, various methods described herein can be provided via storage means (e.g., RAM, ROM, or a physical storage medium such as a compact disc (CD)). Moreover, any other suitable technique for providing the methods and techniques described herein can be utilized. It is to be understood that the scope of the disclosure is not limited to the precise configuration and components illustrated above.

The previous description of the disclosed embodiments is provided to enable a person skilled in the art to make or use the disclosed embodiments. While the foregoing is directed to aspects of the present disclosure, other aspects of the disclosure may be devised without departing from the basic scope thereof, and the scope is determined by the claims that follow. Various modifications, changes and variations may be made in the arrangement, operation, and details of the embodiments described herein without departing from the scope of the disclosure or the claims. Thus, the present disclosure is not intended to be limited to the embodiments herein but is to be accorded the widest scope possible consistent with the principles and novel features as defined by the following claims and equivalents thereof

What is claimed is:

1. A method comprising:
    forming a first poly-silicon gate of a first transistor, the first poly-silicon gate having a first length, wherein the first transistor is located in a first core; and
    forming a second poly-silicon gate of a second transistor, the second poly-silicon gate having a second length that is shorter than the first length, wherein the second transistor is located in a second core, and wherein the first core is located closer to a center of a semiconductor die as compared to the second core, wherein the second transistor and the first transistor are corresponding transistors.

2. The method of claim 1, wherein the first core has a first plurality of transistors arranged in a transistor layout, wherein the second core has a second plurality of transistors arranged in the transistor layout, and wherein corresponding transistors are a pair of transistors, one in the first core and the other in the second core, that are located at the same location in the transistor layout.

3. The method of claim 2, wherein a first corresponding gate length of each transistor of the first plurality of transistors is greater than a second corresponding gate length of each corresponding transistor of the second plurality of transistors by substantially the same amount.

4. The method of claim 1, further comprising:
forming a third poly-silicon gate of a third transistor of a third core, the third poly-silicon gate having the first length; and
forming a fourth poly-silicon gate of a fourth transistor of a fourth core, the fourth poly-silicon gate having the second length, wherein the third core is located closer to the center of the semiconductor die as compared to the fourth core.

5. The method of claim 1, further comprising forming a third poly-silicon gate of a third transistor, the third poly-silicon gate having a third length that is different than the first length, wherein the third transistor is located in a third core of a second semiconductor die.

6. The method of claim 5, further comprising forming a fourth poly-silicon gate of a fourth transistor, the fourth poly-silicon gate having the second length, wherein the fourth transistor is located in a fourth core of the second semiconductor die.

7. The method of claim 6, wherein the third core is located closer to a second center of the second semiconductor die as compared to the fourth core.

8. The method of claim 6, wherein the first length and the third length are determined based on a first location of the semiconductor die on a wafer and based on a second location of the second semiconductor die on the wafer.

9. The method of claim 6, wherein the first length and the third length are determined based on empirical data that corresponds to locations of semiconductor dies on a wafer.

10. The method of claim 6, wherein the first length and the third length are determined based on empirical data that includes manufacturing process variations data.

11. The method of claim 1, further comprising:
forming a third poly-silicon gate of a third transistor located in a third core, the third poly-silicon gate having a third length; and
forming a fourth poly-silicon gate of a fourth transistor located in a fourth core, the fourth poly-silicon gate having a fourth length, wherein the first length is determined by increasing the second length by a first amount, wherein the third length is determined by increasing the fourth length by a second amount, and wherein the first amount is different from the second amount, wherein the first transistor and the second transistor are corresponding transistors, and wherein the third transistor and the fourth transistor are corresponding transistors.

12. The method of claim 1, further comprising:
prior to forming the first poly-silicon gate using the first length:
forming the first core and the second core using the second length;
measuring a first performance parameter associated with the first core;
measuring a second performance parameter associated with the second core; and
determining the first length based on a difference between the first performance parameter and the second performance parameter.

13. The method of claim 12, wherein the first performance parameter is a first amount of leakage current of the first core, and wherein the second performance parameter is a second amount of leakage current of the second core.

14. The method of claim 12, wherein the first performance parameter is a first clock speed of the first core, and wherein the second performance parameter is a second clock speed of the second core.

15. The method of claim 12, wherein the difference is greater than a second difference between the first performance parameter and the second performance parameter when the first core is fainted using the first length and the second core is formed using the second length.

16. The method of claim 1, wherein the first length is determined at a processor integrated into an electronic device.

17. An apparatus comprising:
a first core that includes a first transistor, wherein the first transistor includes a first poly-silicon gate, the first poly-silicon gate having a first length;
a second core that includes a second transistor, wherein the second transistor includes a second poly-silicon gate having a second length, wherein the first core is located closer to a center of a semiconductor die than the second core; and
a third core that includes a third transistor, wherein the third transistor includes a third poly-silicon gate having a third length the first length wherein the third core is located in a second semiconductor die.

18. The apparatus of claim 17, wherein the second transistor and the first transistor are corresponding transistors.

19. The apparatus of claim 17, wherein each gate length of transistors of the first core is greater than each gate length of corresponding transistors of the second core.

20. The apparatus of claim 17, further comprising a fourth core that includes a fourth transistor, wherein the fourth transistor includes a fourth poly-silicon gate having the first length.

21. The apparatus of claim 20, further comprising a fifth core that includes a fifth transistor, wherein the fifth transistor includes a fifth poly-silicon gate having the second length.

22. The apparatus of claim 17, further comprising a fourth core that includes a fourth transistor, wherein the fourth transistor includes a fourth poly-silicon gate having the second length, wherein the fourth core is located in the second semiconductor die.

23. The apparatus of claim 22, wherein the third core is located closer to a second center of the second semiconductor die as compared to the fourth core.

24. The apparatus of claim 17, wherein the first length and the third length are determined based on a first location of the semiconductor die on a wafer and a second location of the second semiconductor die on the wafer.

25. The apparatus of claim 17, wherein the first length and the third length are determined based on empirical data that indicates locations of semiconductor dies on a wafer.

26. The apparatus of claim 25, wherein the empirical data includes performance data of cores that are subject to manufacturing process variations.

27. The apparatus of claim 17, further comprising:
a fourth core; and
a fifth core, wherein the fourth core is located closer to the center of the semiconductor die than the fifth core, wherein gate lengths of transistors of the first core are increased relative to gate lengths of transistors of the second core by a first amount, and wherein gate lengths of transistors of the fourth core are increased relative to gate lengths of transistors of the fifth core by a second amount that is different from the first amount.

28. The apparatus of claim 17, further comprising a device selected from the group consisting of a communications device, a computer, a set top box, a music player, a video player, an entertainment unit, a navigation device, a personal digital assistant (PDA), and a fixed location data unit, into which the semiconductor die is integrated.

29. An apparatus comprising:
first means for processing, wherein the first means for processing includes a first transistor, wherein the first transistor includes a first poly-silicon gate, the first poly-silicon gate having a first length; and
second means for processing, wherein the second means for processing includes a second transistor, wherein the second transistor includes a second poly-silicon gate having a second length that is shorter than the first length, wherein the first means for processing is located closer to a center of a semiconductor die than the second means for processing, and wherein the second transistor and the first transistor are corresponding transistors.

30. The apparatus of claim 29, further comprising: a device selected from the group consisting of a communications device, a cell phone, a smart phone, a tablet computer, a laptop computer, a set top box, a music player, a video player, an entertainment unit, a navigation device, a personal digital assistant (PDA), a fixed location data unit, and a computer, into which the semiconductor die is integrated.

31. A computer-readable storage device storing instructions that are executable by a processor to initiate operations comprising:
initiating a first formation of a first poly-silicon gate of a first transistor, the first poly-silicon gate having a first length, wherein the first transistor is located in a first core; and
initiating a second formation of a second poly-silicon gate of a second transistor, the second poly-silicon gate having a second length that is shorter than the first length, wherein the second transistor is located in a second core, wherein the first core is located closer to a center of a semiconductor die as compared to the second core, and wherein the second transistor and the first transistor are corresponding transistors.

32. The computer-readable storage device of claim 31, wherein the instructions are executable by a processor integrated in an electronic device.

33. A method comprising:
a first step for initiating a first formation of a first poly-silicon gate of a first transistor, the first poly-silicon gate having a first length, wherein the first transistor is located in a first core; and
a second step for initiating a second formation of a second poly-silicon gate of a second transistor, the second poly-silicon gate having a second length that is shorter than the first length, wherein the second transistor is located in a second core, wherein the first core is located closer to a center of a semiconductor die as compared to the second core, and wherein the second transistor and the first transistor are corresponding transistors.

34. The method of claim 33, wherein the first step and the second step are performed by a processor integrated into an electronic device.

35. A method comprising:
receiving design information comprising physical positioning information of a packaged semiconductor device on a circuit board, the packaged semiconductor device comprising:
a first core that includes a first transistor, wherein the first transistor includes a first poly-silicon gate, the first poly-silicon gate having a first length; and
a second core that includes a second transistor, wherein the second transistor includes a second poly-silicon gate having a second length that is shorter than the first length, wherein the first core is located closer to a center of a semiconductor die than the second core, and wherein the second transistor and the first transistor are corresponding transistors; and
transforming the design information to generate a data file.

36. The method of claim 35, wherein the data file has a GERBER format.

37. The method of claim 35, wherein the data file includes a GDSII format.

\* \* \* \* \*